United States Patent
Brunner et al.

(10) Patent No.: US 9,921,466 B2
(45) Date of Patent: Mar. 20, 2018

(54) METHOD FOR MONITORING FOCUS IN EUV LITHOGRAPHY

(71) Applicant: INTERNATIONAL BUSINESS MACHINES CORPORATION, Armonk, NY (US)

(72) Inventors: Timothy Allan Brunner, Ridgefield, CT (US); Martin Burkhardt, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/414,889

(22) Filed: Jan. 25, 2017

(65) Prior Publication Data
US 2017/0192364 A1    Jul. 6, 2017

Related U.S. Application Data

(62) Division of application No. 14/620,803, filed on Feb. 12, 2015, now Pat. No. 9,588,440.

(51) Int. Cl.
| | |
|---|---|
| *G03F 1/24* | (2012.01) |
| *G03F 1/44* | (2012.01) |
| *G03F 7/20* | (2006.01) |
| *G03F 1/80* | (2012.01) |

(52) U.S. Cl.
CPC .................. *G03F 1/24* (2013.01); *G03F 1/44* (2013.01); *G03F 1/80* (2013.01); *G03F 7/2004* (2013.01); *G03F 7/70641* (2013.01)

(58) Field of Classification Search
CPC ..... G03F 1/24; G03F 1/44; G03F 1/80; G03F 7/2004; G03F 7/70641
USPC .............................................. 430/5, 30, 313
See application file for complete search history.

(56) References Cited

PUBLICATIONS

Brunner, Timothy Allan et al., Pending U.S. Appl. No. 14/620,803 entitled "Method for Monitoring Focus in EUV Lithography," filed Feb. 12, 2015.
List of IBM Patents or Patent Applictions Treated as Related; (Appendix P), Filed Jan. 25, 2017, 2 pages.

*Primary Examiner* — Christopher G Young
(74) *Attorney, Agent, or Firm* — Cantor Colburn LLP; Steven Meyers

(57) ABSTRACT

Obtaining optimal focus for exposing a photoresist in an EUV lithography with an EUV mask containing a pattern with an assist feature is disclosed. The EUV mask contains a repeating pattern, wherein the repeating pattern has two different pitches, i.e. a first pitch and a second pitch, and contains an assist feature between main features. Because the two different pitches have different focus offsets, the difference between linewidths of said gratings provides a calibration curve which is a measure of focus. The method for monitoring focus is performing a EUV exposure using a focus position with a pre-determined focus position as calibrated using the linewidth difference between the two gratings. The EUV mask for monitoring focus of present invention is applicable to both test and product masks.

7 Claims, 7 Drawing Sheets

METHOD FOR MONITORING FOCUS IN EUV LITHOGRAPHY

DOMESTIC PRIORITY

This application is a Divisional of the legally related U.S. application Ser. No. 14/620,803 filed Feb. 12, 2015, which is fully incorporated herein by reference.

BACKGROUND

This invention relates generally to a method and an EUV mask for monitoring focus in EUV lithography, and more particularly to a method of obtaining optimal focus for exposing a photoresist covered substrate in an EUV lithography system with an EUV mask containing a repeating pattern with assist features.

In the fabrication of integrated circuits, lithography is used to generate pattern structures on the semiconductor and various materials for the construction of the desired circuit structures. A continuing demand in view of the ever increasing desire in the semiconductor industry for higher circuit density in microelectronic devices has prompted lithographic engineers to develop improved lithographic processes. Especially, a lithographic process can provide improved linewidth control. Many linewidth variations are due to focus uncertainty caused by numerous effects, such as resist thickness variations, bake non-uniformities, batch-to-batch resist sensitivity changes, non-flat wafers, lens field non-flatness etc. Therefore, to improve linewidth control one must either improve the focus window of the process or reduce the focus variations.

A variety of automated schemes for determining tool focus have been adopted. In state of the art exposure systems, there is an auto focus leveling sensor system to adjust the wafer in Z direction (perpendicular to resist surface) to achieve the best focus for resist exposures. Although the auto focus leveling sensor system will accurately place the wafers being exposed at the best focus location (or a predetermined offset from this position) by high-precision mechanical means, it is still susceptible to slight drifts in the position mechanism or changes in the required offset for various wafer stacks or various material sets (different photoresists, interlayers and/or underlayers). In addition, variations in imaging and process parameters may cause variations in the best focus position in the resist film, which in turn may cause variations in the dimensions of printed patterns. Therefore, the focus position adopted in the exposure system must be continually monitored to ensure that the linewidth of printed patterns is tightly controlled within an acceptable range.

The most direct method of achieving higher area density is to improve the resolution of circuit patterns in resist films. One way of improving the resolution in resist is to migrate to shorter wavelength from 365 nm to 248 nm, then to 193 and 157 nm, to go to extremely small wavelengths optical systems such as EUV (extreme ultraviolet), or to adopt non optical system such as E-beam. EUV lithography with exposure wavelengths below 20 nm allows the industry to print features beyond the diffraction limit of the current 193 nm lithography without resorting to the adoption of tricks using double or triple patterning. Focus variations can also be caused by diffraction effects due to the three-dimensional nature of the mask absorber features which are large compared to the wavelength of EUV. The three-dimensional features interact with the incident and reflected electromagnetic field and can cause focus variations on the wafer. These focus variations mean that it becomes even more important to have a metric for focus.

Some focus monitoring methods have been reported previously to determine focus variations during lithographic process. For example, Brunner et al., in U.S. Pat. No. 5,300,786, teach a focus monitoring method that can be used to accurately determine the best focus and focal plane in an optical projection system, but it requires the use of a specialized mask that cannot be integrated with product masks. The mask requires a 90 degree phase shift which is not a standard process. To fabricate 90 degree phase shift for EUV mask is very hard, likely involving offsetting the multilayer in Z direction, thus it is impractical to add this feature to a production mask. Although Sun et al. in a 2013 SPIE paper (Proc. of SPIE, Vol. 8679, pp. 86790T1-12, 2013) demonstrate an EUV mask having phase shift mask structure with 90.9° and 180° phase shifts for focus monitoring, they also disclose how difficult it is to build such phase-shifted targets. This is more evidence that EUV phase shift mask is too expensive and impractical for actual production of EUV masks.

In addition, Brunner et al., in U.S. Pat. No. 7,455,939, teach a method of making a process monitor grating pattern for use in a lithographic imaging system. The method measures focus in a single exposure, and uses sidewall angle of a resist measured by scatterometer to determine focus. In EUV lithography, extremely thin resists (~30 nm) are used with rough sidewall, so the sidewall angle measurement is very hard if not impossible.

SUMMARY

According to an aspect of the present invention, there is provided a method for monitoring focus in an EUV lithography system containing: providing a substrate containing a photoresist layer; exposing, with EUV radiation, and printing the photoresist layer at different focus positions with a mask containing a repeating pattern of two different pitches which include a first pitch and a second pitch, wherein the repeating pattern of at least one of the two different pitches contains an assist feature; determining a first relationship between printed linewidths of the photoresist layer and the different focus positions under the repeating pattern of the first pitch in the mask; determining a second relationship between printed linewidths of the photoresist layer and the different focus positions under the repeating pattern of the second pitch in the mask; establishing a calibration curve which contains printed linewidth differences of the two different pitches at the different focus positions; and performing EUV exposure on photoresists or other photo sensitive materials using a focus position which is pre-determined as a focus position on the calibration curve.

Exposing the photoresist layer under the repeating pattern in the mask results in a printed photoresist pattern selected from a group consisting of lines, trenches, holes, studs, and mixtures thereof. The lines or trenches include horizontal lines or trenches and vertical lines or trenches. The assist feature generally has a linewidth in a range from about 20 nm to about 60 nm on the EUV mask, which corresponds to a range from about 5 nm to about 15 nm in wafer dimensions on the printed photoresist pattern. The assist feature is generally not printed on the photoresist pattern. The photoresist layer used in EUV lithography generally has a thickness in a range from about 10 nm to about 40 nm. The first pitch and the second pitch are selected from a set of pitches inspected to give a largest or sufficient difference at their best focus positions for the printed photoresist pattern. Optimum pitches may be different depending on illuminator and can be predicted using simulation software or experimental results. However, most illuminators at small pitch will have similar behavior. The illumination may be a quasar illumination, and more specifically the illumination may be a 25° or 45° quasar illumination system with $\sigma_{out}/\sigma_{in}=088/0.37$. Other illumination conditions may be used. The current state-of-the-art EUV exposure system has a numerical aperture (NA) of 0.33. Higher NA is expected to provide better resolution for printing resist images. The projection system of the EUV lithography has a demagnification of 4×, so the feature sizes of the repeating pattern in the mask are four times the feature sizes of the printed photoresist pattern on the substrate. The EUV mask used here for monitoring the focus may be a product mask or a test mask. The product mask is for producing products. The method used here is not dependent on photoresist. The photoresist used for EUV lithography may be a chemically amplified resist.

According to another aspect of the present invention, there is provided an EUV mask for monitoring focus in an EUV lithography containing: a mask substrate; a multilayer reflector on the mask substrate; and an absorber over the multilayer reflector, the absorber containing a repeating pattern of two different pitches which include a first pitch and a second pitch, wherein the first pitch and the second pitch are selected from a set of pitches inspected to give a largest or sufficient difference at their best focus positions for a printed photoresist pattern, and the repeating pattern of at least one of the two different pitches contains an assist feature.

For the above EUV mask for monitoring focus in EUV lithography, the best focus positions for the printed photoresist pattern for the above set of pitches are determined by: exposing, with EUV radiation, and printing a photoresist layer at different focus positions with a mask containing the repeating pattern of the set of pitches; determining relationships between printed linewidths of the photoresist layer and the different focus positions under the repeating pattern of the set of pitches; and identifying their best focus positions based on the relationships. The printed photoresist pattern obtained through an EUV exposure over the repeating pattern of a mask on a photoresist layer, may contain patterns of lines, trenches, holes, studs, and mixtures thereof. The above EUV mask for monitoring focus in EUV lithography may contain a capping layer. The multilayer reflector may contain 40 layers of molybdenum (Mo) and silicon (Si) double layer, and the absorber may contain tantalum or other EUV absorbing materials. The absorber may contain Ta, TaN, TaBN, TaBON, TaGeN, Cr, $CrO_x$, Ge, Al, Al—Cu, Cu, $Al_2O_3$, Ti, TiN, SnTe, ZnTe, or mixtures thereof. The assist feature is generally has a linewidth in a range from about 20 nm to about 60 nm in the EUV mask, which corresponds to a range from about 5 nm to about 15 nm on the printed photoresist pattern.

According to yet another aspect of the present invention, there is provided a method of making a test pattern in an EUV mask for monitoring focus in EUV lithography containing: providing a substrate containing a photoresist layer; exposing, with EUV radiation, and printing the photoresist layer at different focus positions with a mask containing a repeating pattern of a set of pitches, wherein the repeating pattern of at least one pitch contains an assist feature; determining relationships between printed linewidths of the photoresist layer and the different focus positions under the repeating pattern of the set of pitches; identifying best focus positions based on the relationships; and selectively etching an absorber of an EUV mask to form the repeating pattern of two different pitches which include a first pitch and a second pitch, wherein the first pitch and the second pitch are selected from the set of pitches inspected to give a largest or sufficient difference at their best focus positions for a printed photoresist pattern.

The above EUV mask with the absorber selectively etched also contains a substrate, a multilayer reflector, and may also contain a capping layer. The multilayer reflector may contain 40 layers of molybdenum and silicon double layer, and the absorber may contain tantalum or another EUV absorbing material. The absorber may contain Ta, TaN, TaBN, TaBON, TaGeN, Cr, $CrO_x$, Ge, Al, Al—Cu, Cu, $Al_2O_3$, Ti, TiN, SnTe, ZnTe, or mixtures thereof. The assist feature generally has a linewidth in a range from about 20 nm to about 60 nm on the EUV mask, which corresponds to a range from about 5 nm to about 15 nm on the scale of wafer coordinates in the printed photoresist pattern. The printed photoresist pattern using the above EUV mask may contain patterns of lines, trenches, holes, studs and mixtures thereof. The EUV mask made here for monitoring the focus may be a product mask or a test mask. The product mask is for producing products. The step of selectively etching an absorber of an EUV mask may be replaced with a step of: selectively depositing an absorber of an EUV mask to form the repeating pattern of two different pitches which include a first pitch and a second pitch, wherein the first pitch and the second pitch are selected from the set of pitches inspected to give a largest or sufficient difference at their best focus positions for a printed photoresist pattern.

According to still yet another aspect of the present invention, there is provided a method of monitoring focus in an EUV lithography system containing: providing a substrate containing a photoresist layer; exposing, with EUV radiation, and printing the photoresist layer at different focus positions with a mask containing a repeating pattern of two different pitches which include a first pitch and a second pitch, wherein the repeating pattern of at least one of the two different pitches contains an assist feature; determining a first relationship between printed linewidths of the photoresist layer and the different focus positions under the repeating pattern of the first pitch in the mask; determining a second relationship between printed linewidths of the photoresist layer and the different focus positions under the repeating pattern of the second pitch in the mask; identifying a reference focus position where a printed linewidth of the first pitch is same as a printed linewidth of the second pitch; and performing EUV exposure on photoresists or other photo sensitive materials using a focus position with a pre-calibrated offset from the identified reference focus position.

DETAILED DESCRIPTION

This invention relates generally to a method and an EUV mask for monitoring focus in EUV lithography. The invention also relates to a method of making the EUV mask for monitoring focus in EUV lithography. Specifically, the focus monitoring method provides a way to obtain an optimal focus for exposing a photoresist in an EUV lithography system with an EUV mask containing a pattern with an assist feature.

To differentiate from regular X-ray, the EUV wavelength is usually referred to as being in a range from about 5 nm to about 40 nm. This range overlaps with the soft X-ray range which is generally in a range from about 2 nm to about 20 nm. The current EUV lithography uses an EUV source at around 11 nm to 14 nm, more specifically at 13.5 nm. Since the wavelength is much shorter than the current 193 nm optical system used in the industry, the potential advantage of being capable of resolving much smaller dimension of photoresist images should be realized with the adoption of this technology.

Figure 1:
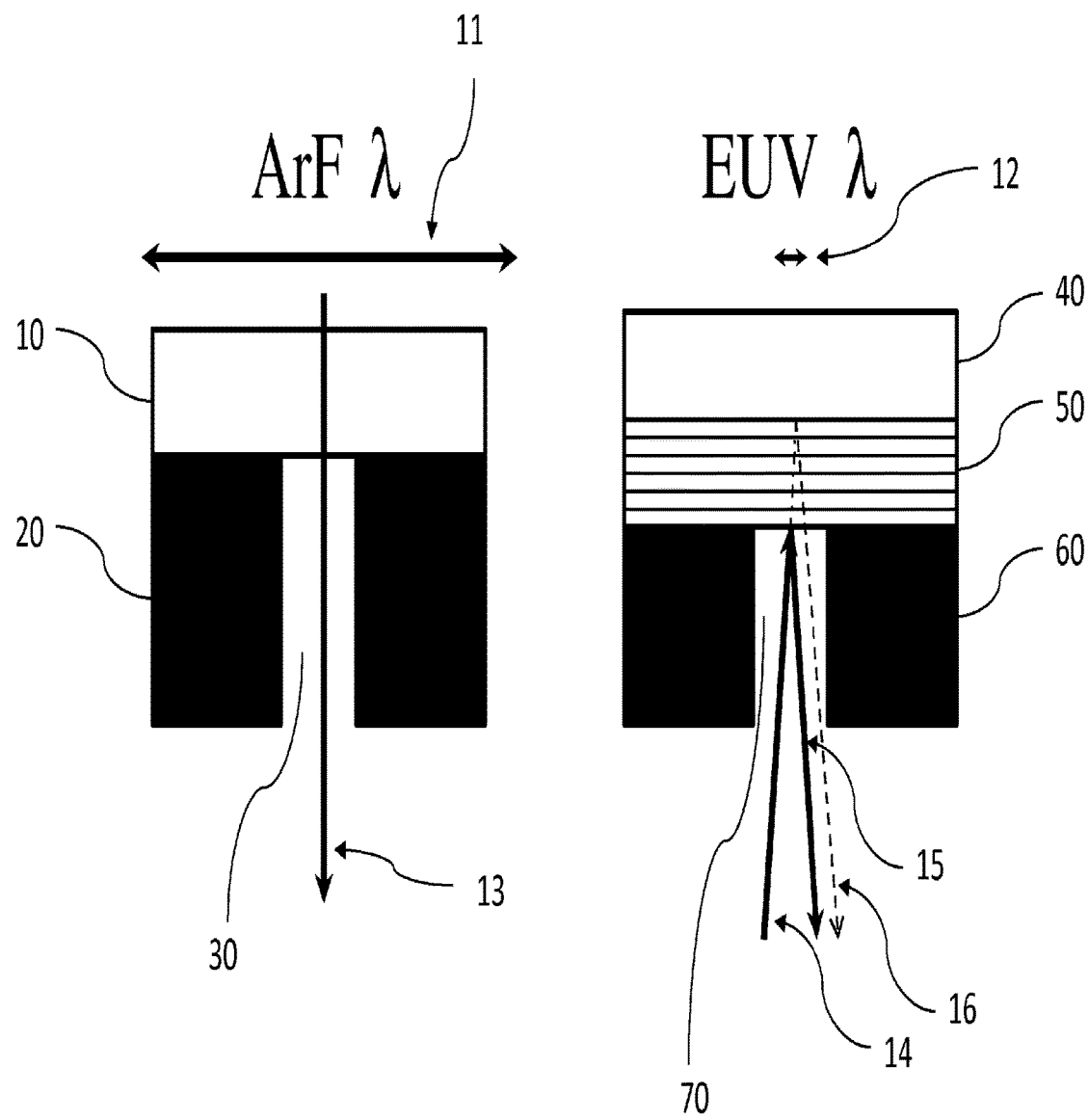
FIG. 1 is a schematic cross-sectional diagram representing an assist feature on an ArF Mask and on an EUV mask according to one embodiment of the present invention.

Referring to FIG. 1, the 193 nm (ArF wavelength) photolithography uses an imaging system which directs an ArF radiation 13 through a mask, and then through a 4× (or 5×) demagnification projection system to project the image of that pattern onto a photoresist layer on top of a semiconductor wafer for later development and etch. For EUV lithographic system, the EUV radiation 14 is reflected from a mask to form a pattern, then the reflected light 15 and 16 containing the image of that pattern is projected through a 4× demagnification projection system onto a photoresist layer on top of a semiconductor wafer. In addition, there may be an 'anamorphic' system with demagnification of 4× in one direction and 8× in the other direction. The regular ArF mask contains a mask substrate 10 with an absorber 20 over the substrate, while the EUV mask contains a mask substrate 40, a multilayer reflector 50 and an absorber 60. The material for the ArF mask substrate 10 is usually high quality fused quartz, and the material for the absorber 20 may be chromium or OMOG (opaque MoSi on glass). The material for the EUV mask substrate 40 is usually low thermal expansion quartz which may be doped with titania ($TiO_2$). The multilayer reflector 50 may contain 40 layers of molybdenum and silicon double layer. On top of the multilayer reflector the stack may contain a capping layer (not shown in FIG. 1, it would be between layers 50 and 60) which is usually ruthenium. The absorber 60 is generally a tantalum based material and is optimized for 193 nm inspection and to reduce EMF (electromagnetic field) effect. It may be Ta, TaN or TaBN material. An exemplary assist feature (~40 nm here) size in the ArF lithography as shown in the mask opening 30 is much smaller than the ArF wavelength 11, while the same assist feature size in the EUV lithography as shown in the mask opening 70 is much larger than the EUV wavelength 12. This big difference between ArF lithography and EUV lithography results in different diffraction effect in the photolithographic process, especially when the masks have assist features. While the absorber thickness and width are smaller than the wavelength of light in the case of ArF and the mask can be considered 'thin' compared to the wavelength, in the case of EUV both the lateral dimension and the absorber thickness are larger than the wavelength, thus creating a 'thick' mask. In addition, for the EUV mask the light travels along the absorber twice because EUV uses reflective masks. While the light travels along the absorber edge it interacts with the absorber which has a refractive index smaller than that of vacuum, thus accelerating the light along the absorber edge. For the smaller assist feature this effect is stronger than for the larger main feature, thus causing the different focus properties for main features with and without assist features. Assist features are usually sub-resolution features being used to enhance the image quality or process window of the main features. They are placed in proximity of the main features on the mask and are generally not printed in the final photoresist images. They usually have the same or similar shape as the main features, such as lines, trenches, bars, holes . . . etc but are smaller in size. The assist feature generally has a linewidth (or spacewidth) in a range from about 20 nm to about 60 nm in the EUV mask, which corresponds to a range from about 5 nm to about 15 nm on the printed photoresist pattern. The assist feature is generally not printed on the photoresist pattern. The term "linewidth" represents the width of any feature not just of a line feature. For a line feature, it is the width of the line. For a trench feature, it is the width of the trench or space, and may be called a spacewidth or trenchwidth. For a contact hole or stud feature, it is the diameter of the hole or stud. The feature includes main feature and assist feature. Since the drawing in FIG. 1 is intended for illustrative purpose, the drawing is not necessarily drawn to scale. The drawing also only shows a few layers of the multilayer reflector, and does not show the entire 40 layers of the Mo—Si. The absorbers may contain ARC (antireflective layer), and the substrate may contain other layer or layers, such as CrON layer. These are not shown in the drawing in FIG. 1 either.

In addition to the absorber opening 70 being generally larger than the EUV wavelength 12 as shown in FIG. 1, the thickness of the absorber is also generally larger than both the assist opening 70 and the EUV wavelength 12. The opening 70 is in vacuum, thus the real part of the refractive index $n_{vac}$ is 1 and the imaginary part of the refractive index $k_{vac}$ is 0. The typical absorber 60 currently used in the industry has the real part of the refractive index $n_{abs}$ around 0.90 to 0.96, and has the imaginary part of the refractive index $k_{abs}$ around approximately 0.03 or higher. The difference between $n_{vac}$ and $n_{abs}$ here is sufficient to cause a significant phase shift when assist features are introduced to the EUV mask, thus causing a focus drift between different pitches in the printed photoresist images. The present invention provides a method to monitor the focus in EUV lithography to address this focus shift issue, and at the same time the invention uses this focus shift property in the monitoring method. The focus monitoring method is to create a mask with two test gratings, and then it uses the focus shift of the printed resist images under these two gratings to adjust the focus. The preferred test gratings are horizontal or vertical trenches. At least one of the test gratings requires an assist feature, but the present invention can be used to monitor focus for a desired printing pattern with or without assist features.

One embodiment of the present invention includes a method of making a test pattern in an EUV mask for monitoring focus in EUV lithography. The method is described in the flow chart of FIG. 2. At block 201 of FIG. 2, a substrate containing a photoresist layer is provided. The substrate is usually a semiconductor substrate, for example a silicon wafer. The substrate may contain other materials under photoresist layer, for example organic bottom antireflective coating (BARC), silicon antireflective coating (SiARC), underlayer (UL), or combinations thereof. At block 202 of FIG. 2, the photoresist layer is exposed with EUV radiation at different focus positions with a mask containing a repeating pattern of a set of pitches, wherein the repeating pattern of at least one pitch contains an assist feature. In many instances, the exposure also contains various doses. Combining different focuses and exposure doses, usually called Focus-Exposure Matrix (FEM), to determine the best process condition is common in the lithographic community. The thickness of the photoresist layer may be in a range from about 10 nm to about 40 nm, preferably from about 20 nm to about 35 nm. The photoresist layer after exposure is then processed with a commonly known photoresist process, such as baking and then developing with a developer, to form a printed photoresist image on the substrate. The photoresist may be a chemically amplified photoresist or a non-chemically amplified photoresist. The photoresist for EUV lithography may also be either positive tone or negative tone. The repeating pattern may be any type such as lines, trenches, holes, and studs. The shape may also vary for the same type, for example a hole may be round, oval, square or rectangular. The repeating pattern may also contain mixtures of different types or shapes. In the present invention, finding the optimum pitches can be done either experimentally or by simulation. For the simulation, a commercial software tool is used that is able to calculate the exact diffraction orders that are reflected off the mask. The tool uses a description of the incident light, in one example case a quasar illumination, and the information of the exact layer stack and calculates the electromagnetic field that surrounds the mask, including the multi layer stack and the absorber materials. The reflected diffraction orders are propagated in the same simulation tool to predict the incident intensity in the wafer plane, and are then able to predict the linewidth of the resulting resist image. Such simulation tools are ubiquitous in the lithography industry today and they are very good at predicting trends and sensitivities, such as relative focus shifts, while being less good at predicting absolute numbers. Such simulations can be used to select the best pitches for maximum focus shift, and can thus replace the experimental methods.

Figure 3:
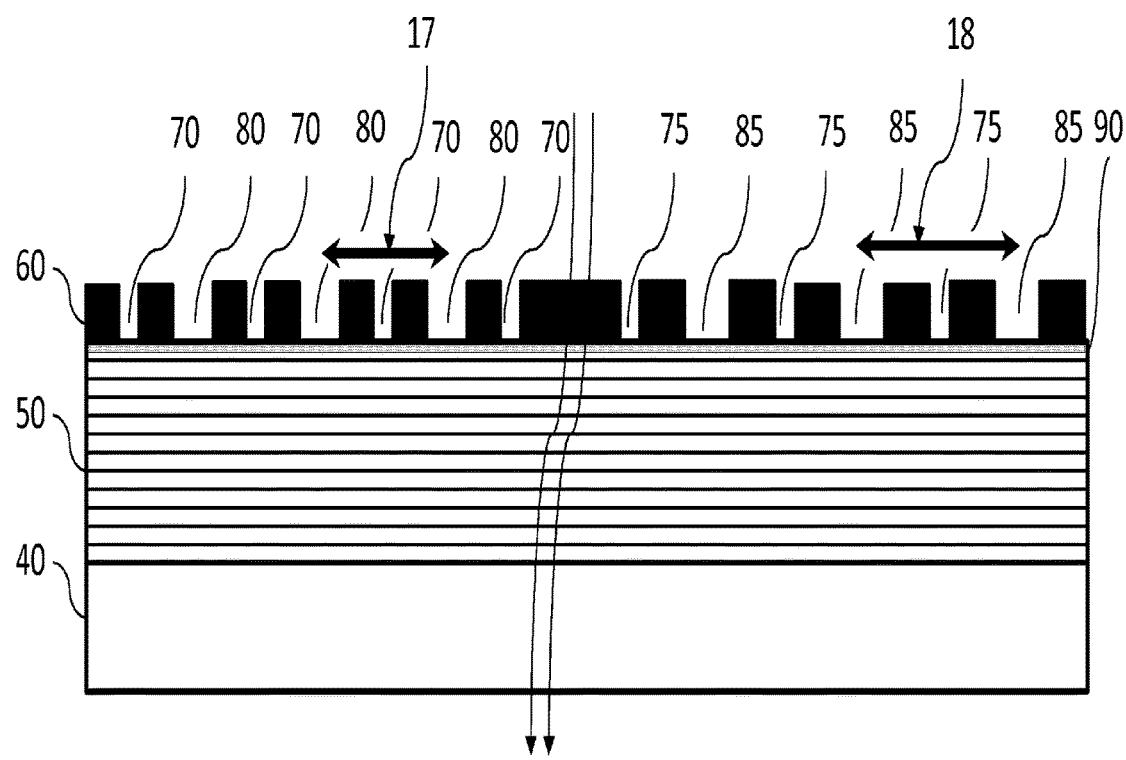
FIG. 3 is a schematic cross-sectional diagram representing a repeating pattern of two different pitches with a single assist feature between main features on a mask for EUV according to one embodiment of the present invention.

The preferred repeating pattern for the present invention is a repeating pattern capable of printing a group of repeating lines or trenches, i.e. gratings. The lines or trenches may be vertical, horizontal or both. The repeating pattern on the EUV mask for printing the test gratings may contain an assist feature. As shown in FIG. 3, a schematic cross-sectional diagram of an EUV mask for printing trenches with positive photoresist, there are two assist feature openings 70 on each side of a main trench feature opening 80. In the printing process the assist feature will not be printed on the photoresist layer. The printed photoresist images will contain a group of repeating trenches with a pitch which is one fourth of the mask pitch 17. FIG. 3 only shows 3 trench sets of the repeating pattern of pitch 17 for illustrative purpose on the left, and 3 trench sets of the repeating pattern of pitch 18 on the right. The grating with pitch 18 on the right may have slightly different main feature openings 85 and slightly different assist feature openings 75, or it may have no assist feature openings at all. The EUV mask used in the embodiment here contains a set of pitches with many trenches in each pitch. Choice of the pitch sizes of the set of pitches may be based on the pitch range of the product wafer (or test wafer) to be monitored. The number of pitches of the set of pitches should be at least 3. In some instances, 2 pitches are predetermined, and then there is no selection process. The repeating pattern may contain no assist features in some pitches of the set of pitches. Besides mask substrate 40, multilayer reflector 50 and absorber 60, FIG. 3 also shows a capping layer 90. Regular EUV mask preferably includes a capping layer. Since the drawing in FIG. 3 is intended for illustrative purpose, the drawing is not necessarily drawn to scale. The drawing also only shows a few layers of the multilayer reflector, and does not show the entire 40 layers of the Mo—Si double layer.

Figure 2:
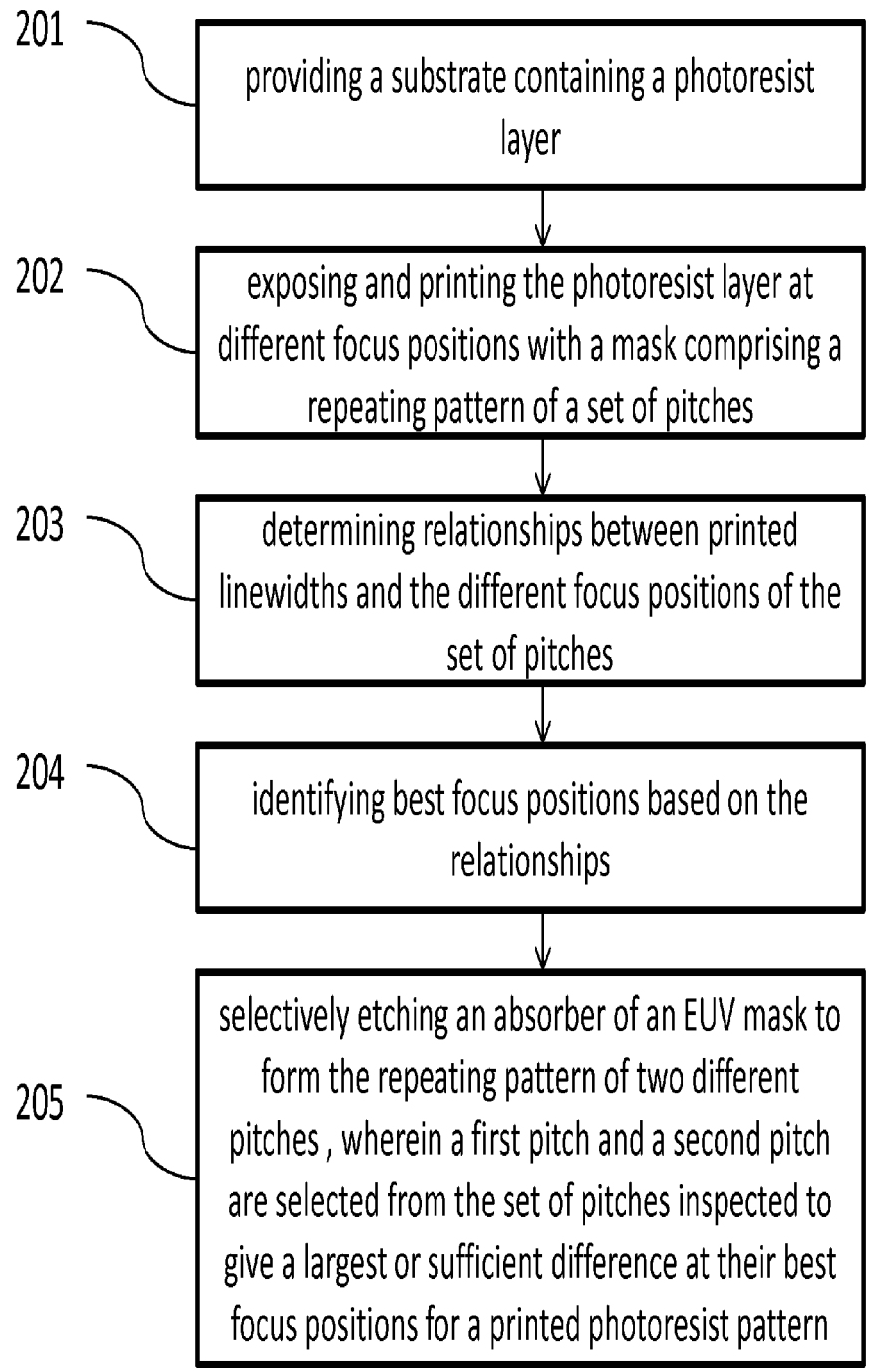
FIG. 2 is a flow chart of a method of making a test pattern in an EUV mask for monitoring focus in EUV lithography according to one embodiment of the present invention.

At block 203 of FIG. 2, the relationships between printed linewidths (or spacewidths for trenches) of the photoresist layer and the different focus positions under the repeating pattern of the set of pitches are determined. To determine the relationship between printed linewidth and focus, a plot of linewidth versus focus is constructed. The linewidths are measured from the printed photoresist images with scanning electron microscope (SEM), atomic force microscopy (AFM), or scatterometry. Each relationship is determined by each plot of linewidth vs. focus at each pitch of the set of pitches chosen in the investigation.

At block 204 of FIG. 2, the best focus positions based on the relationships are identified. The plot of linewidth vs. focus is usually called Bossung plot. In 1977, J. W. Bossung first described a plotting method to determine the best focus and exposure dose (which he called exposure energy) for maintaining the Critical Dimensions (CDs) of printed patterns from lithography. Ever since then, Bossung Plots have been used to analyze the CD variation of a printed feature vs. the focus latitude and the exposure latitude. The Bossung Plot usually exhibits either "smile" (turn upward across focus positions) or "frown" (turn downward across focus positions), except at the isofocal dose, the curve is almost flat and relatively insensitive to changes in focus positions. The bottom of the smile or the top of the frown is the best focus position. The best focus positions are identified based on the Bossung Plots for the different pitches in the set of pitches.

At block 205 of FIG. 2, an absorber of an EUV mask is selectively etched to form the repeating pattern of two different pitches, wherein a first pitch and a second pitch are selected from the set of pitches inspected to give a largest or sufficient difference at their best focus positions for a printed photoresist pattern. In the selected two pitches which include the first pitch and the second pitch, the repeating pattern of at least one pitch contains an assist feature. As shown in FIGS. 1 and 3, the EUV mask may contain a mask substrate 40, a multilayer reflector 50 and an absorber 60. The material for the EUV mask substrate 40 may be any substrate which has low thermal expansion, such as ultralow expansion titanium silicate glass. The multilayer reflector 50 may contain 40 layers of molybdenum and silicon alternating double layer. Other materials may alternatively be used for the multilayer reflector 50, such as a Mo/Be multilayer stack, a Ru/Si multilayer stack, a Si/Mo/Ru multilayer stack, a Si/Mo/Sr multilayer stack, a Si/Mo/Ru/Mo multilayer stack, and a Si/Ru/Mo/Ru multilayer stack. The multilayer reflector 50 may contain from about 20 to about 80 layers of molybdenum and silicon alternating double layer. The thickness of the alternating layer may be in the range from about 2 nm to about 10 nm. One specific example, the alternating layers of Mo and Si with thickness of ~4.1 nm and ~2.8 nm respectively are deposited onto mask substrate 40 to build up to 40 or more pairs each having thickness of ~6.9 nm (4.1+2.8) for 13.40 nm EUV wavelength operation. The total thickness of the multilayer reflector 50 may be in the range from about 160 nm to about 800 nm. The absorber 60 may contain Ta, TaN, TaBN, TaBON, TaGeN, Cr, $CrO_x$, Ge, Al, Al—Cu, Cu, $Al_2O_3$, Ti, TiN, SnTe, ZnTe, or mixtures thereof. On top of the multilayer reflector the stack may contain a capping layer 90 which is usually ruthenium. Other materials may be used for the capping layer 90, such as $SiO_2$, C, Cr, Rh, or CrN. In some instances, the EUV mask may further contain a conductive coating (not shown in FIG. 1 or 3) formed on a back side of the substrate 40 to allow for electrostatic chucking. The conductive coating may contain Cr or CrN, or other suitable materials. An EUV mask with the absorber 60 not patterned is etched using any suitable etching technique. In general, a photoresist layer is patterned on top of the absorber and that pattern is replicated into the absorber by etching the absorber in locations not covered by the photoresist layer to form the mask features, such as the patterned features shown in FIG. 3. The etching process is generally a process with reactive etching using proper etchant. Alternatively, the absorber 60 with desired mask features is deposited on an EUV mask which has no absorber 60 on top of the multilayer reflector 50. Generally, a photoresist layer is patterned on top of the multilayer reflector 50 and that pattern is replicated onto the multilayer reflector 50 by depositing the absorber in locations not covered by the photoresist layer to form the mask features, such as the patterned features shown in FIG. 3. Various deposition processes include but are not limited to: physical vapor deposition, chemical vapor deposition and electrochemical deposition. After etching or depositing, the photoresist layer is then stripped with the method commonly known in the industry. The pattern etched or deposited here is the repeating pattern of two different pitches, wherein a first pitch and a second pitch are selected from the set of pitches inspected to give a largest or sufficient difference at their best focus positions for a printed photoresist pattern. The best focus positions for a printed photoresist pattern for the set of pitches are determined at the step of block 204 of FIG. 2. The first pitch and the second pitch are selected within this set of pitches to give a largest or sufficient difference at their best focus positions. Sometimes the largest difference is so big that the second largest or third largest may be sufficient. Large difference at their best focus positions generally results in large difference in printed linewidths. In this case, any two pitches with sufficient difference at their best focus positions may be selected. The sufficient difference in this invention represents a difference of about 35 nm or larger. Optimum pitches may be different depending on illuminator. However, most illuminators at small pitch will have similar behavior. The illumination may be a 25° quasar illumination system with $\square_{out}/\square_{in}$=088/0.37. Quasar is a quadrupole illumination system. Generally, the regions of the quadrupole illumination are not square in shape, but are often circular or annular sections. The illumination may also be a 45° quasar or other angles. Other illumination condition may also be used for other lithographic requirement. The current EUV stepper has an NA of 0.33. Higher NA is contemplated for future generation EUV tool set. The projection system of the EUV lithography has a demagnification factor of 4×, so the feature sizes of the repeating pattern in the mask are four times the feature sizes of the printed photoresist pattern on the substrate. Larger demagnification factors, such as 8×, and even anamorphic systems with one magnification in one direction and a second magnification in the other direction are contemplated in the industry. The repeating pattern of at least one of these two pitches in EUV mask contains an assist feature. The assist feature generally has a linewidth (or spacewidth) in a range from about 20 nm to about 60 nm in the EUV mask, which corresponds to a range from about 5 nm to about 15 nm on the printed photoresist pattern. Exemplary assist feature 70 is shown in FIG. 3. The EUV mask containing the repeating pattern of these two pitches described above in the absorber 60 acting as a special focus test target is useful for monitoring focus in EUV lithography. The EUV exposure may then be performed using a focus position pre-calibrated based on the relationships between printed linewidth and focus of these two pitches. The EUV exposure may be performed on a photoresist over a substrate. The substrate is generally a semiconductor substrate, for example a silicon wafer. The EUV exposure may also be performed on other photo sensitive materials. The sequence of the steps in the flow chart in FIG. 2 is preferred. However, the invention is not limited to the performance of these steps with the sequence or order presented in this flow chart. Many steps may also be applied to the substrate before, between or after the steps shown in this flow chart.

Another embodiment of the present invention includes an EUV mask for monitoring focus in EUV lithography. An exemplary EUV mask for monitoring focus in EUV lithography may contain a mask substrate which generally has low thermal expansion, such as ultralow expansion titanium silicate glass. On top of the substrate the stack may contain a multilayer reflector which may contain 40 layers of molybdenum and silicon alternating double layer. On top of the multilayer reflector may contain a capping layer which may be ruthenium. On top of the capping layer it may contain an absorber which may contain Ta, TaN, TaBN, TaBON, TaGeN, Cr, $CrO_x$, Ge, Al, Al—Cu, Cu, $Al_2O_3$, Ti, TiN, SnTe, ZnTe, or mixtures thereof. The absorber contains a repeating pattern of two different pitches, wherein a first pitch and a second pitch are selected from a set of pitches inspected to give a largest or sufficient difference at their best focus positions for a printed photoresist pattern, and the repeating pattern of at least one of the two different pitches comprising an assist feature. Optimum pitches may be different depending on illuminator. However, most illuminators at small pitch will have similar behavior. The illumination may be a 25° quasar illumination system with $\sigma_{out}/\sigma_{in}$=088/0.37. Other illumination condition may also be used for other lithographic requirements. The current EUV stepper has an NA of 0.33. Higher NA is contemplated for future generation EUV tool set. The printed photoresist pattern obtained through the EUV exposure over the repeating pattern of the EUV mask on a photoresist layer may be lines, trenches, holes, studs or mixtures thereof. The printed photoresist pattern is generally trench gratings. The representative repeating pattern of the EUV mask may be referred to FIG. 3. To determine their best focus positions of the printed photoresist pattern is by the following steps: (1) exposing with EUV radiation and printing the photoresist layer at different focus positions with a mask comprising the repeating pattern of the set of pitches; (2) determining relationships between printed linewidths of the photoresist layer and the different focus positions under the repeating pattern of the set of pitches; and (3) identifying the best focus positions based on the relationships. Choice of the pitch sizes of the set of pitches may be based on the pitch range of the product wafer to be monitored. The number of pitches of the set of pitches should be at least 3. Each relationship is determined by each plot of linewidth (or spacewidth for trenches) vs. focus at each pitch of the set of pitches chosen in the investigation. The best focus positions are identified based on the Bossung Plots for the different pitches in the set of pitches. The repeating pattern of at least one of these two pitches in EUV mask contains an assist feature. The assist feature generally has a linewidth in a range from about 20 nm to about 60 nm in the EUV mask, which corresponds to a range from about 5 nm to about 15 nm on the printed photoresist pattern. The EUV mask for monitoring focus in EUV lithography may further contain a conductive coating formed on a back side of the substrate to allow for electrostatic chucking. The conductive coating may contain Cr or CrN. The EUV mask for monitoring focus in EUV lithography may be either a test mask or a product mask. A product mask is used for exposing product wafers and producing products, and sometimes is also called production mask. A test mask is only for testing, not for producing products. By placing the repeating pattern of the first pitch and the second pitch at specific locations outside the active area of a product mask, the EUV mask for monitoring focus in EUV lithography of the present invention can be a product mask. The repeating pattern of these two pitches described above acting as a special focus test target is then used for monitoring focus of the pattern in the active area in EUV lithography. The EUV exposure may be performed using a focus position pre-determined based on the relationships between printed linewidth and focus under these two pitches.

Yet another embodiment of the present invention includes a method of monitoring focus in an EUV lithography system. The method is described in the flow chart of FIG. 4. At block 401 of FIG. 4, a substrate containing a photoresist layer is provided. The substrate is usually a semiconductor substrate, for example a silicon wafer. The substrate is also suitably any substrate conventionally used in the semiconductor process. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices. The substrate may contain other materials under photoresist layer, for example organic BARC, SiARC, UL, or combinations thereof. The photoresist layer is usually formed on the substrate through a process including a spin coating step and a baking step. The photoresist may be a chemically amplified photoresist or a non-chemically amplified photoresist. The photoresist for EUV lithography may also be either positive tone or negative tone. The thickness of the photoresist layer may be in a range from about 10 nm to about 40 nm, preferably from about 20 nm to about 35 nm.

Figure 4:
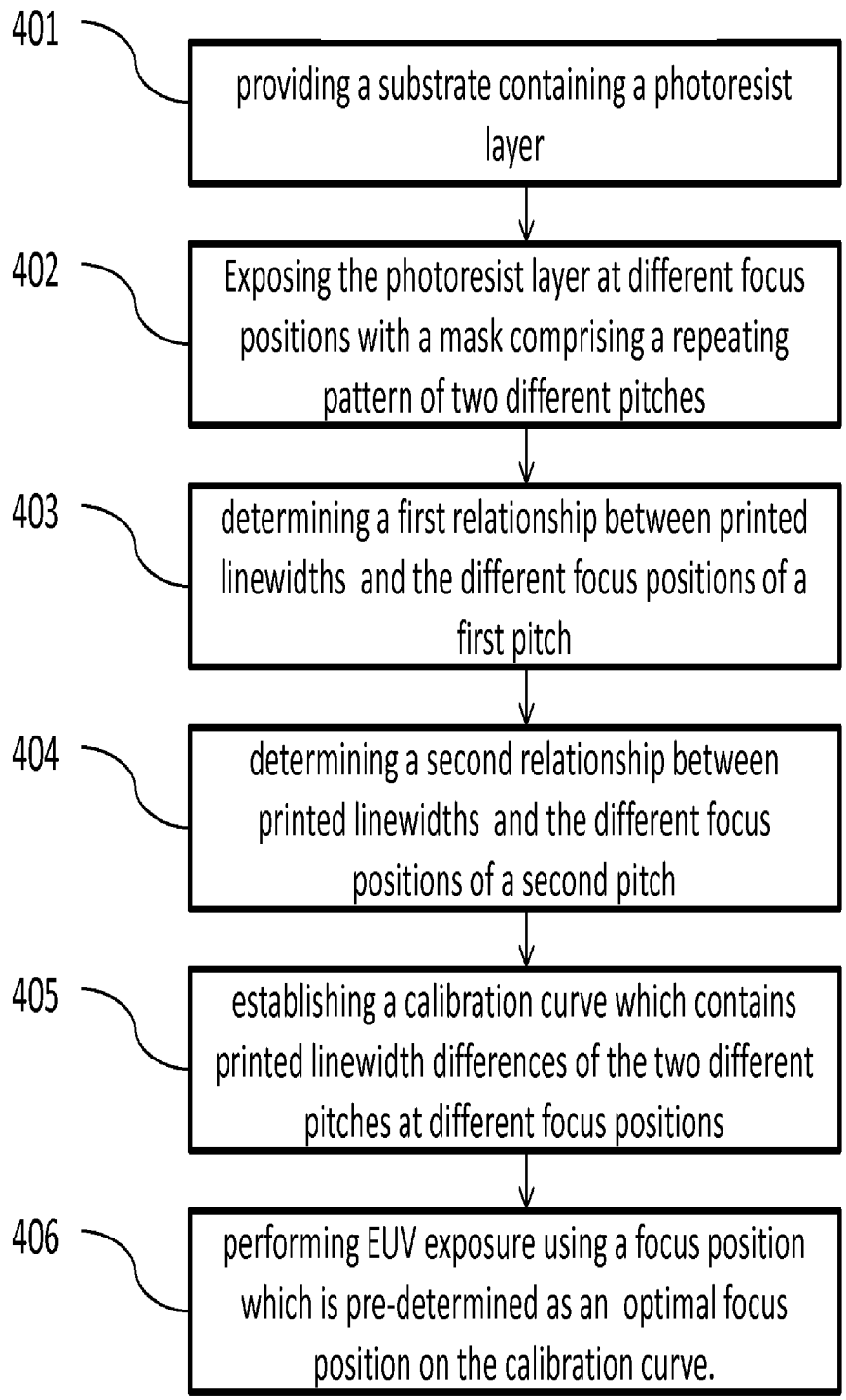
FIG. 4 is a flow chart of a method for monitoring focus in an EUV lithography apparatus according to one embodiment of the present invention.

At block 402 of FIG. 4, the photoresist layer is exposed with EUV radiation and printed at different focus positions with a mask containing a repeating pattern of two different pitches, wherein the repeating pattern of at least one pitch contains an assist feature. The mask is an EUV mask for monitoring focus in EUV lithography as described in other embodiments of the present invention. The absorber of the EUV mask for monitoring focus in EUV lithography contains a repeating pattern of two different pitches, wherein a first pitch and a second pitch are selected from a set of pitches inspected to give a largest or sufficient difference at their best focus positions for a printed photoresist pattern, and the repeating pattern of at least one pitch containing an assist feature. The photoresist layer after exposure is then processed with a typical photoresist process, such as baking and then developing with a developer, to form printed photoresist images on the substrate. The repeating pattern may be any type such as lines, trenches, holes, and studs. The shape may also vary for the same type, for example a hole may be round, oval, square or rectangular. The repeating pattern may also contain mixtures of different types or shapes. The preferred repeating pattern for the present invention is a repeating pattern capable of printing a group of repeating lines or trenches, i.e. gratings. The lines or trenches may be vertical, horizontal or both. For example, vertical trenches are a group of repeating trenches aligned parallel in the vertical direction, while the horizontal trenches are aligned perpendicular to the vertical direction. The repeating pattern of at least one pitch on the EUV mask for monitoring focus in EUV lithography for printing the test gratings contains an assist feature. An example of the repeating pattern as shown in FIG. 3, a schematic cross-sectional diagram of an EUV mask for printing trenches, there are two assist feature openings 70 on each side of a main trench feature opening 80. In the printing process, the assist feature will not be printed on the photoresist layer. The printed photoresist images will contain a group of repeating trenches with a pitch which is one fourth of the mask pitch 17 for the first selected grating, and another set of repeating trenches with a pitch which is one fourth of the mask pitch 18.

At block 403 of FIG. 4, a first relationship is determined between printed linewidths (or called spacewidths for trenches) of the photoresist layer and the different focus positions under the repeating pattern of the first pitch in the mask. The first relationship is determined by a plot (Bossung Plot) of linewidth vs. focus at the first pitch. At block 404 of FIG. 4, a second relationship is determined between printed linewidths of the photoresist layer and the different focus positions under the repeating pattern of the second pitch in the mask. The second relationship is determined by a plot of linewidth vs. focus at the second pitch.

At block 405 of FIG. 4, a calibration curve which comprises printed linewidth differences of the two different pitches at different focus positions is established. The calibration curve is obtained by calculating the differences in linewidths for the two different pitches, and then linewidth differences are plotted versus focus positions. This calibration curve is then used as a reference curve for calibrating focus for any other focus positions of interest. The focus position with zero difference in linewidth is the position where the Bossung Plot of the first pitch intersects the Bossung Plot of the second pitch. Any focus position of interest can be either in the positive direction or in the negative direction in this calibration curve.

At block 406 of FIG. 4, an EUV exposure is performed using a focus position which is pre-determined as an optimal focus position on the calibration curve. An optimal focus position is a position of interest, which may be determined by the user of this invention. The embodiment of the present invention here provides a method for monitoring focus in EUV lithography, and more particularly to a method of obtaining optimal focus for exposing a photoresist in an EUV lithography system. The optimal focus position may or may not be at the focus position with zero difference in linewidth on the calibration curve. The optimal focus position may be determined through the regular means such as Bossung Plots of a desired test pattern or a desired product pattern. The optimal focus position may also be determined by the desired image fidelity or the desired specific linewidth of the image. For some instances, the optimal focus position may not provide the best image quality, but provides a special image profile such as tapered profile or undercut profile. The focus position of the pattern to be monitored may be very different from these test gratings. For example, the patterns to be monitored may not have the same kind of assist feature, or may not have assist features at all, thus would have very different focus positions of these two test gratings. After the optimal focus position is determined, a focus position on the calibration curve of this optimal focus position can be located. The EUV exposure may then be performed on a photoresist over a semiconductor substrate using a focus position which is pre-determined as the optimal focus position on the calibration curve. The EUV exposure may also be performed on other photo sensitive materials. Exemplary photo sensitive materials are photo-sensitive dielectrics and developable bottom antireflective coatings (DBARC). FIG. 4 and the associated steps 401 through 406 describes the calibration sequence so that the focus can be determined by just looking at the widths of the lines of the two different pitch gratings. Once this calibration curve is recorded, one can then determine focus for each wafer that may be exposed during regular manufacturing process and no more through-focus or through-dose experiments have to be performed. The sequence of the steps in the flow chart in FIG. 4 is preferred. However, the invention is not limited to the performance of these steps with the sequence or order presented in this flow chart. Many steps may also be applied to the substrate before, between or after the steps shown in this flow chart.

At block 405 and 406, a calibration curve is used as a reference curve for calibrating focus for any other focus positions of interest. Alternatively, a reference focus position is identified at a focus position where a printed linewidth of the first pitch is the same as a printed linewidth of the second pitch. The reference focus position is the position where the Bossung Plot of the first pitch intersects the Bossung Plot of the second pitch, where the linewidth difference between the two pitches is zero. This intersect position is then used as a reference focus position for any other focus positions of interest. An EUV exposure is then performed on a photo-resist over a semiconductor substrate using a focus position with a pre-calibrated offset from this identified reference focus position. The EUV exposure may also be performed on other photo sensitive materials. The embodiment of the present invention here provides a method for monitoring focus in EUV lithography, and more particularly to a method of obtaining optimal focus for exposing a photoresist in an EUV lithography. The optimal focus position may or may not be the same as the reference focus position. The optimal focus position may be determined through the regular means such as Bossung Plots of a desired test pattern or a desired product pattern. The optimal focus position may also be determined by many reasons as described in the previous paragraph. After the optimal focus position is determined, a calibrated offset of this optimal focus position to the identified focus position can be obtained. This offset value only needs to be calibrated once in the process. The EUV exposure may then be performed on a photoresist over a semiconductor substrate using a focus position with this pre-calibrated offset from the identified reference focus position. The EUV exposure may also be performed on other photo sensitive materials.

Some specific examples are given below to illustrate the embodiments of the present invention. Since these examples are given for illustrative purpose only, the invention is not limited to the specific details of the examples.

Example 1

Figure 5:
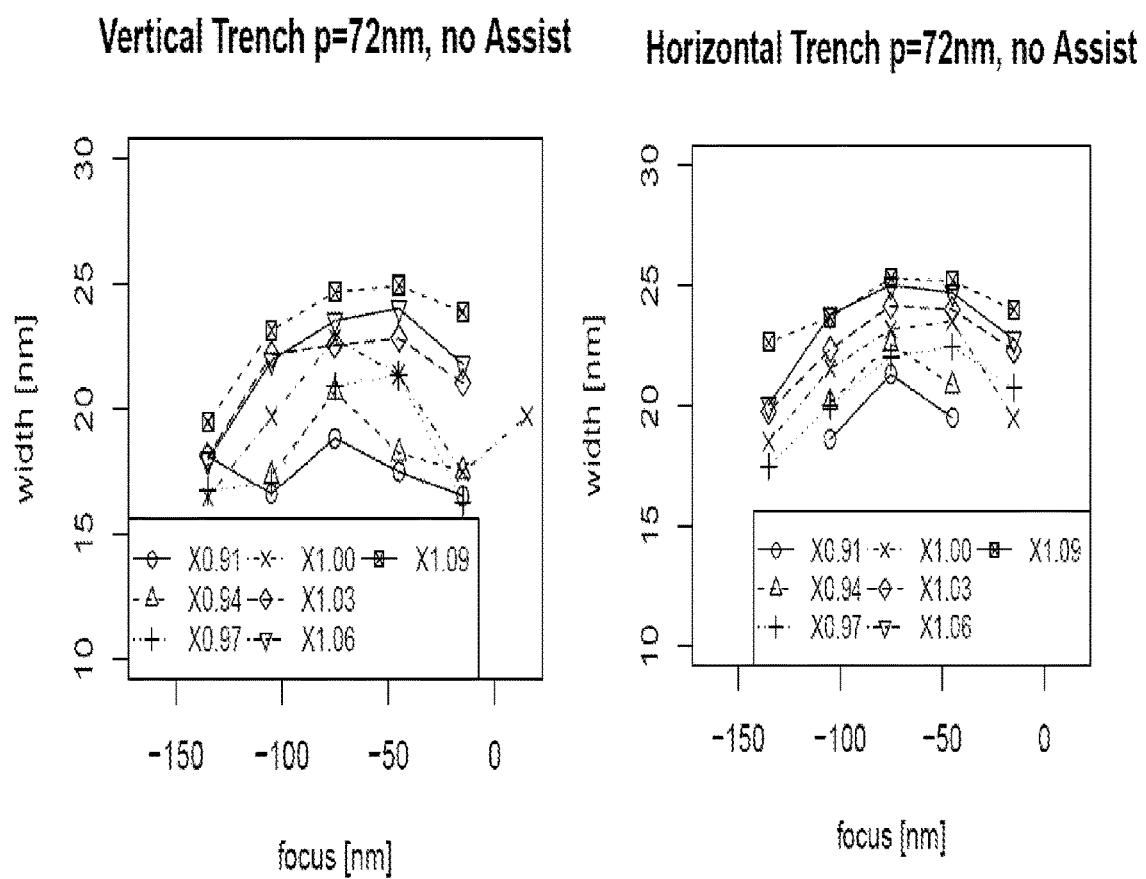
FIG. 5 is a plot of experimental linewidth vs. focus for different exposure doses for vertical (left) and horizontal (right) trenches at a pitch of 72 nm on the wafer with no assist features according to one embodiment of the present invention.

Referring to FIG. 5, the plot shows the experimentally measured width of trenches through focus, for seven different exposure doses. The left plot shows values for vertical trenches, the right plot shows values for horizontal trenches. The dose multiplier relative to the center dose is shown in the legend for each of the curves. A dose multiplier of 1.03, for example, indicates a dose that is 3 percent higher than the center dose. A higher dose leads to a larger width for the printed trench. The pitch of the structures that are measured on this wafer is 72 nm, while the measured width of the trenches is between about 15 and 25 nm. The pitch of the openings on the mask is four times the pitch on the wafer, or 288 nm in this case. There are no assist features between the main features. This is the reason for the strong variations in width through focus for the Bossung curves shown here. The mask is illuminated with quadrupole illumination that is described in the previous paragraphs.

Example 2

Figure 6:
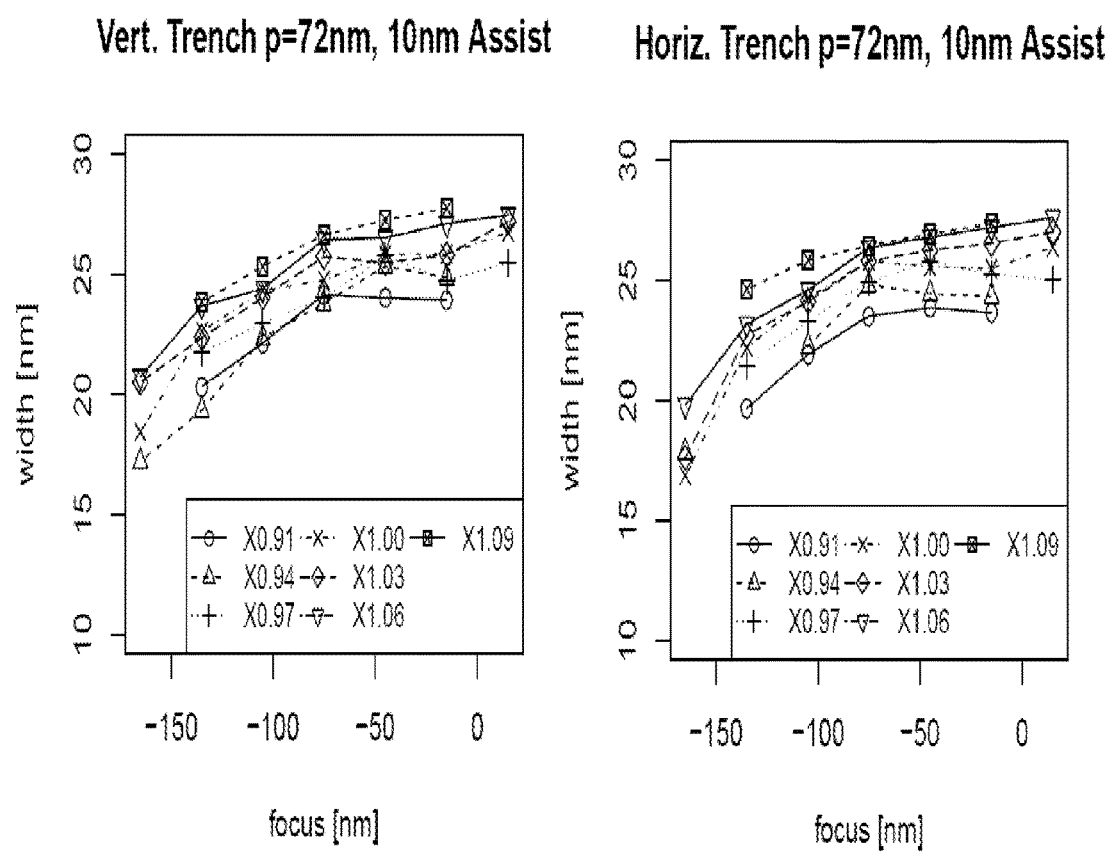
FIG. 6 is a plot of experimental linewidth vs focus for different exposure doses for vertical (left) and horizontal (right) trenches at a pitch of 72 nm on the wafer with assist features of nominal width of 10 nm in wafer dimensions between the main trenches according to one embodiment of the present invention.

Referring to FIG. 6, the plot shows experimentally measured width of trenches through focus for printed trenches of the same pitches and exposure conditions as shown in FIG. 5, with the only difference being the addition of assist features between the main features on the mask. The best focus, defined as the focus for which the slope of the linewidth vs focus curve is horizontal, is moved to much more positive values for the assist feature case shown in FIG. 6 compared to the best focus in FIG. 5.

Example 3

Figure 7:
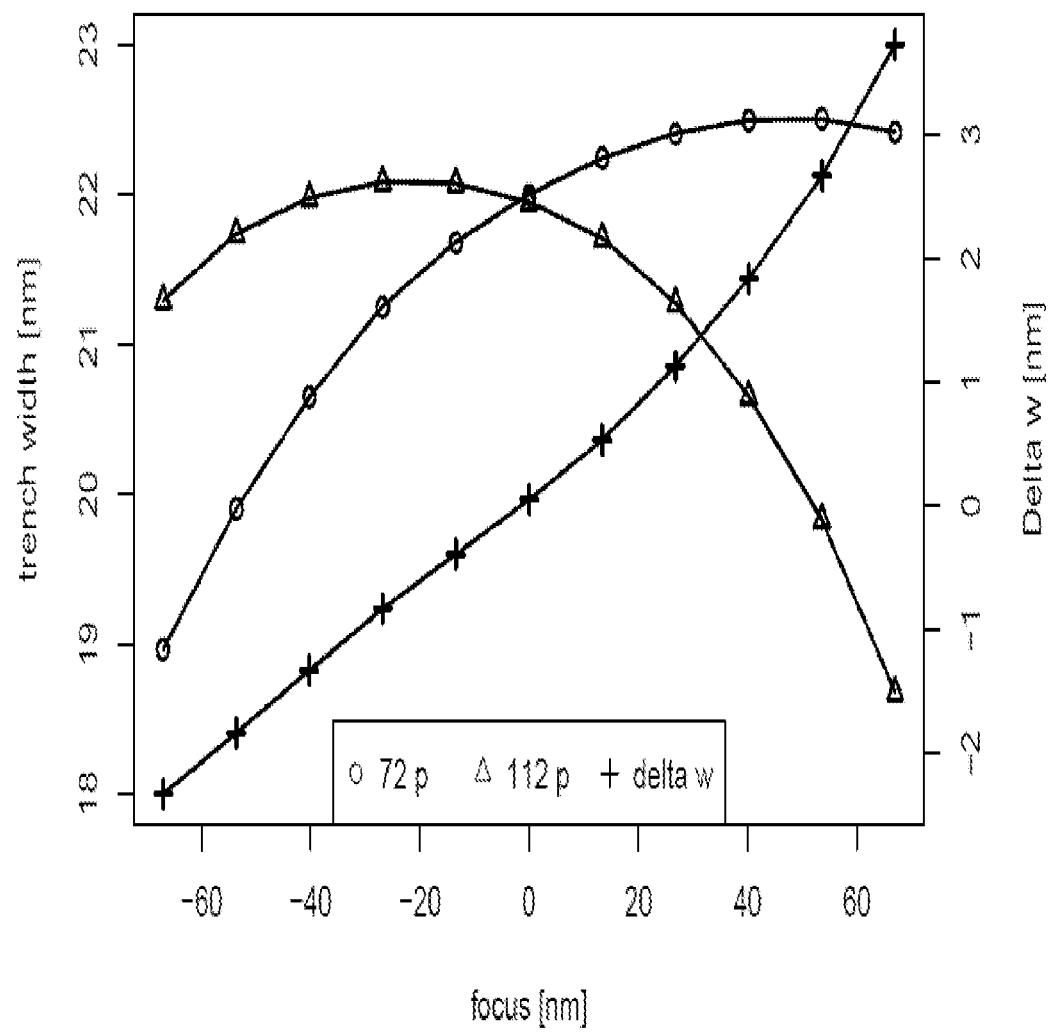
FIG. 7 is a plot of simulations of linewidth vs focus for the 72 nm and the 112 nm pitch trenches with 10 nm wide assist features between the main features, and a calibration curve plot which contains the difference in linewidth between the 72 nm and the 112 nm pitch features can be used as a signal indicating focus position according to one embodiment of the present invention.

Referring to FIG. 7, the plot shows the simulated focus response of the trench width for only the best dose. Shown is the focus response for a 72 nm pitch grating with 10 nm assist features, and a 112 nm pitch grating with 10 nm assist features, as well as the difference between the linewidth at the two pitches, with the scale to the right. When the difference between the two linewidths is taken, it shows a monotonically increasing signal with focus which can be calibrated for a process according to the flow chart in FIG. 4. This monotonic function of linewidth difference vs. focus then serves as a definite metric so that the focus can be determined for any exposed wafer by just measuring two linewidths for the two different pitches and taking the difference. For the simulation results shown in FIG. 7, a commercial software tool is used that is able to calculate the exact diffraction orders that are reflected off the mask. Such simulations can be used to select the best pitches for maximum focus shift, and can thus replace the experimental methods described in steps 201 and 202 of FIG. 2. Because the simulation method described here is good at predicting trends rather than absolute numbers, the flow shown in FIG. 4 for calibration of the focus response of an existing pair of grating pitches can likely not be replaced with simulations unless the simulation tool is calibrated exactly to the wafer process that is used in manufacturing.

What is claimed is:
1. A method of making a test pattern in an EUV mask for monitoring focus in an EUV lithography comprising:
   providing a substrate containing a photoresist layer;

exposing, with EUV radiation, and printing the photoresist layer at different focus positions with a mask comprising a repeating pattern of a set of pitches, wherein the repeating pattern of at least one pitch comprises an assist feature;

determining relationships between printed linewidths of the photoresist layer and the different focus positions under the repeating pattern of the set of pitches;

identifying best focus positions based on the relationships; and selectively etching or depositing an absorber of an EUV mask to form the repeating pattern of two different pitches, wherein a first pitch and a second pitch are selected from the set of pitches inspected to give a largest or sufficient difference at their best focus positions for a printed photoresist pattern.

2. The method of claim 1, wherein selectively etched or deposited EUV mask comprises a substrate, a multilayer reflector, and the absorber.

3. The method of claim 2, wherein the selectively etched or deposited EUV mask further comprises a capping layer.

4. The method of claim 2, wherein the multilayer reflector comprises 40 layers of molybdenum and silicon double layer.

5. The method of claim 2, wherein material of the absorber is selected form a group consisting of Ta, TaN, TaBN, TaBON, TaGeN, Cr, $CrO_x$, Ge, Al, Al—Cu, Cu, $Al_2O_3$, Ti, TiN, SnTe, ZnTe, and mixtures thereof.

6. The method of claim 2, wherein the selectively etched or deposited mask is a product mask for producing products.

7. The method of claim 1, wherein the assist feature has a linewidth in a range from about 20 nm to about 60 nm.

* * * * *